United States Patent [19]
Erhart et al.

[11] Patent Number: 5,381,063
[45] Date of Patent: Jan. 10, 1995

[54] AC OFFSET COMPENSATION FOR ACTIVE LCD DRIVERS

[75] Inventors: Richard A. Erhart, Chandler; Thomas W. Ciccone, Paradise Walley, both of Ariz.

[73] Assignee: Medtronic, Inc., Minneapolis, Minn.

[21] Appl. No.: 976,126

[22] Filed: Nov. 13, 1992

[51] Int. Cl.$^6$ .............................................. H03K 5/13
[52] U.S. Cl. .................................. 327/288; 327/206; 327/261
[58] Field of Search ............... 307/290, 603, 605, 608, 307/602

[56] References Cited

U.S. PATENT DOCUMENTS

| | | | |
|---|---|---|---|
| 4,392,066 | 7/1983 | Hirao | 307/603 |
| 4,812,687 | 3/1989 | Larson et al. | 307/605 |
| 4,904,884 | 2/1990 | O'Shaughnessy et al. | 307/290 |

*Primary Examiner*—Steven L. Stephan
*Assistant Examiner*—Shawn Riley
*Attorney, Agent, or Firm*—Harold R. Patton

[57] ABSTRACT

A compensation circuit equalizes processing (speed) differences between driver chips used to drive an active matrix LCD display by inserting a delay in opposite proportion to the speed of the driver IC so that a faster IC will receive a longer delay and a slower IC will receive a shorter delay.

2 Claims, 5 Drawing Sheets

AC OFFSET COMPENSATION FOR ACTIVE LCD DRIVERS

BACKGROUND OF THE INVENTION

1. Field of the Invention

The present invention pertains to liquid crystal display (LCD) drivers, and in particular pertains to a signal processing system which will compensate for processing (speed) differences between driver chips used to drive an active matrix LCD display.

2. Description of the Prior Art

Military and commercial applications for flat panel, active matrix LCD's are growing. There is a need for "next generation" IC's which can take full advantage of the capabilities of current and upcoming active matrix displays by providing extreme image accuracy with a large number of gray levels. Space is a primary concern in applications using flat panel displays.

Active matrix displays can provide advantages over conventional LCD's in the areas of viewing angle, response time and information content. Military and commercial applications such as cockpit displays, mapping displays and imaging systems can utilize these features to create extremely accurate image reproductions. A new generation of complex mixed signal driver chips are required to implement these systems.

Current system architectures for LCD drivers employ both row and column driver IC's. The column driver is a high speed chip having responsibility for accurate generation of the gray shade voltage levels. These IC's need to be fast, handle large voltages, have a multitude of outputs, provide low offset error, contain tens of thousands of transistors, and yet minimize power. These conflicting design issues require careful analysis in the light of current IC technology.

In previous active matrix driver chips, offset error was not an issue due to the relatively slow speed of the chips and the low number of gray scales provided. In a 256 gray level display however, the offset error at the outputs is a critical electrical issue affecting system performance. Offset error will appear as a shading problem on the display and may cause unwanted or fuzzy image features. Many "track and hold" applications strive to minimize offset between outputs but may allow for a system tuning process to adjust for a common offset. Applications such as displays however, use multiple IC's in the same system. Individual tuning of 30 or more IC's is undesirable. The offsets must not only match on chip, but from chip to chip as well. This presents a significant design problem due to IC process variations. The contributors to output error include: 1. leakage on the hold capacitor, 2. amplifier DC offset error, 3. switch capacitor error and 4. aperture error (jitter, uncertainty and delay).

Aperture delay is a measure of the delay between the external clock edge and the internal edge which actually causes the voltage to be held. This is a transient case and is one of the largest contributors to the overall error because all chips in the system need to have identical aperture delay.

The present invention provides a speed compensation circuit which solves the aperture delay problem. The compensation circuit is designed to equalize the delay for all chips, under all processing conditions. The effect is to add delay to the faster processes.

SUMMARY OF THE INVENTION

The purpose of the present invention is to compensate for the processing (speed) differences between driver chips used to drive an active matrix LCD display by inserting a delay in opposite proportion to the speed of the driver IC i.e. a faster IC will receive a longer delay and a slower IC will receive a shorter delay.

According to the preferred embodiment of the present invention, there is a compensation circuit which employs a constant current source which is mirrored twice to create two source currents, a large one and a small one. The source currents drive a capacitor, preferably the input capacitance of a Schmidt trigger circuit. The Schmidt trigger is set to switch when the source currents drive it's input gate voltage to a predetermined level. Compensation commences when the input signal activates a dual mode switch internal to the compensation circuit. In the first mode, both source currents are coupled to the input gate of the Schmidt trigger. This condition is maintained for a predetermined first time period established by a delay network internal to the compensation circuit. After a second predetermined amount of time, but before the first time period has expired, the dual mode switch deactivates the large source current, leaving only the small source current coupled to the input gate of the Schmidt trigger. This transition will cause a change in the slope of the input to the Schmidt trigger.

The initial slope of the input to the Schmidt trigger is identical for any input signal regardless of signal speed. This is due to the constant current source drive. A phase difference exists however due to signal processing. The initial input amplitude reached is a function of the first time period in which both source currents are coupled to the Schmidt trigger. The faster IC's will reach a lower amplitude faster because the delay is shorter. Subsequently, the large source current is decoupled from the input gate to the Schmidt trigger leaving only the small source current connected. This causes a change in the slope of the input. The slope of the input to the Schmidt trigger, although now changed, remains identical for any input signal regardless of signal speed. However, the faster processes now lag the slower ones. The Schmidt trigger is designed to switch at a low voltage, causing the delay through this circuit to be greater for the fast processes.

Significant aspects and features of the present invention include the ability to easily alter the slopes of signals with appropriate design of current sources and loads. This then allows for the design of any difference in delay necessary to compensate for the overall delay in the path between the input and output signals.

Another significant aspect and feature is the requirement of a single constant current source to control the delay for a plurality of current mirrors, capacitors, level sensors and samplers. In one embodiment, 64 independent circuits of the type hereinbefore described in the preferred embodiment are all connected to a single constant current source.

Yet another significant aspect and feature is the ability to be completely integrated. Along with integration comes the following: more reliable, takes less space, costs less, and versatile for different customer requirements. Also, the inventory management is one device which can now do the job of many devices.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENT

Figure 1:
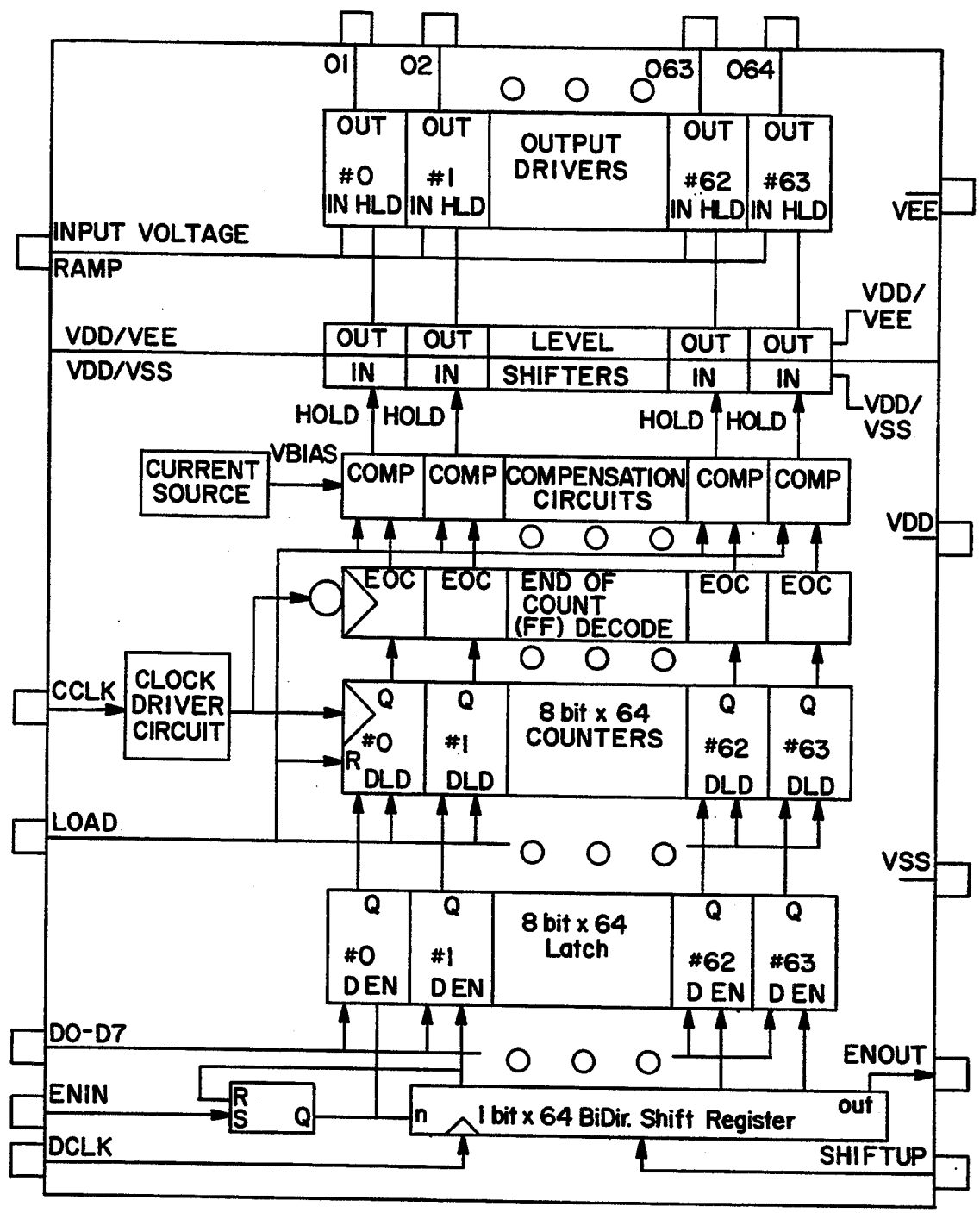
FIG. 1 illustrates a block diagram of a system configured to use the present invention.

FIG. 1 is a block diagram of an example IC 100 using the inventive compensation circuit 102. This IC 100 is capable of 256 shading levels on 64 different outputs 104. Data is sent to the IC 100 in 8 bit quantities across the data bus 106 and is clocked in using the DCLK signal 108. The ENIN signal 110 is a pulse used as an enable to the IC 100 to signal that it should start latching data. The IC 100 will then latch the next 64 8 bit data packets 112 sent across the data bus 106. The ENIN signal 110 is passed through a 64 bit bidirectional shift register 114, which shifts the ENIN signal 110 through the register 114. The 64 outputs 116 of the shift register 114 are sent to the enable 118 of 648 bit latches 120, causing the latching of the data bus 106. The 8 bit latches 120 will therefore capture the contents of the data bus 106 for 64 clock cycles following the ENIN signal 110. The last output 122 of the shift register 122 is passed out of the IC 100 as the ENOUT signal 124. This will allow cascading of these IC's 100 if this output 122 is connected to the ENIN input 126 of the next IC 100. The shift register 114 is bidirectional to allow shifting through the IC's 100 in either direction.

Each of the 64 8 bit data packets 112 determines 1 of 256 different shading levels. Each of the 64 outputs 104 can therefore be programmed to it's own shading level. This is accomplished in the following manner:

When all the 64 8 bit data packets 112 have been loaded, the LOAD signal 126 is pulsed, causing the contents of the latches 120 to be loaded into 64 8 bit counters 128. These values determine the starting counts for the counters 128. The counters 128 are then clocked, using the CCLK signal 130, and when 256 is reached (End of Count) the decoders 132 will signal this with a EOC signal 134 (End of Count). This EOC signal 134 goes to the compensation circuits 136, which will be explained hereinafter, and then causes a HOLD signal 138 to be passed through the level shifters 140 to the output drivers 142. This instructs the output drivers 142 to hold the present voltage being input by the voltage ramp 144. Up until this time all the outputs 104 were tracking this input ramp 144 and causing their outputs 104 to follow this ramp 144. When a particular counter 128 times out, it's output 146 will hold the present value of the ramp voltage 144. This means that each output 104 is capable of 256 different time periods before it will hold the ramp voltage 144. Since the ramp 144 is constantly changing at a linear rate, this translates to the ability for each output 104 to hold 1 of 256 different, equally spaced, voltage levels.

The different voltage levels are a function of the rate of the input ramp voltage 144 and the frequency of the CCLK signal 130. If the slew rate of the ramp 144 is expressed as $RAMP_{slew}$ in volts/second and the period of the CCLK signal 130 is expressed as $PER_{cclk}$ in seconds, then any given voltage level is expressed as:

$$V(t) = K + (RAMP_{slew} * PER_{cclk}). \qquad 1.1$$

The actual voltage at an output 104 can be expressed by the initial voltage on the ramp 144, the count value loaded 126, the ramp slew rate and the period of CCLK 130 as follows:

$$V_{out} = VRAMP_{initial} + [RAMP_{slew} * PER_{cclk} * (256 - COUNT)]. \qquad 1.2$$

This assumes however, that there is no delay from the CCLK signal 130 to the time the output driver 142 actually holds the ramp voltage 144. Any delay between CCLK 130 and the output driver 142 will cause the actual voltage to have an offset from the value given by equation 1.2 above. These delays are inevitably present and the actual voltage will be given by:

$$V_{out} = VRAMP_{initial} + \{RAMP_{slew} * [DELAY + (-PER_{cclk} * (256 - COUNT))]\}. \qquad 1.3$$

For an individual IC 100 this delay will simply cause a shift of all the output voltages 104 by an amount equal to $RAMP_{slew} * DELAY$, assuming all the delays are the same for all the outputs 104 which can be done with proper design techniques. Other IC's 100 however, may have a large or smaller delay due to processing differences which causes speed variation between the different IC's 100.

Figure 2:
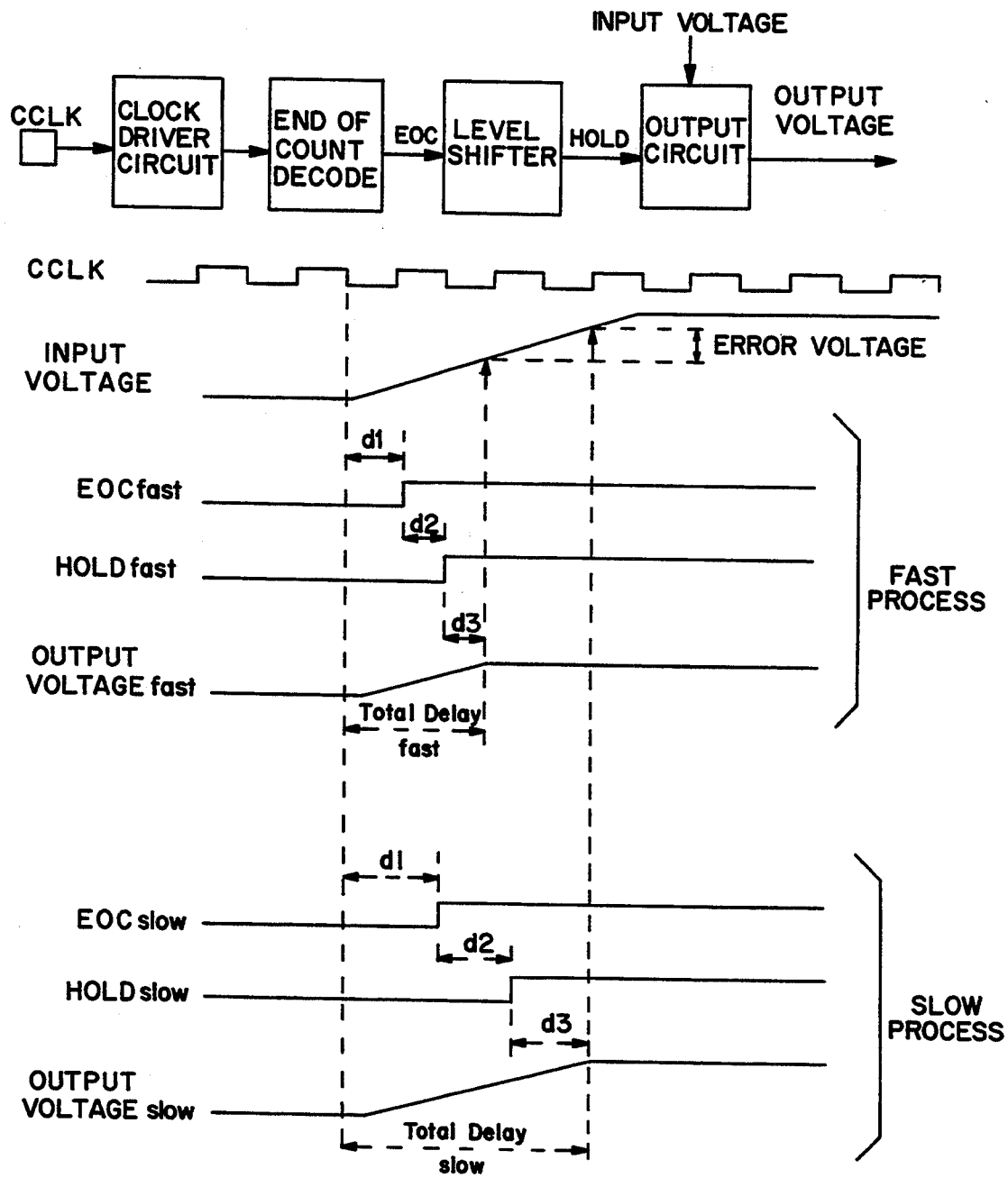
FIG. 2 illustrates the problem of speed variation between different driver chips due to processing differences which is necessary to be corrected by the present invention.

Moving now to FIG. 2, the speed variation problem to be resolved is illustrated by showing the signal timing for a "fast" IC 100 and a "slow" IC 100. The falling edge of CCLK 130 is seen by both IC's 100. The total delay 206, 216 from CCLK 130 falling edge to when the output driver 142 holds the voltage 144 is given by the sum of the delays d1 200, 210+d2 202,212+d3 206, 216, where d1 200, 210 is the delay through the clock driver circuit 148 and the decode circuit 132, d2 202, 212 is the delay through the level shifter 140, and d3 206, 216 is the delay in the output driver 142 itself before the voltage 144 is captured. The signals are shown for both cases of "fast" 218 and "slow" 220 processing.

As can be seen in FIG. 2, the IC's 100 will hold a different voltage 222, 224 due to the difference in their delays 206, 216. This error voltage 208 can be expressed from equation 1.3 as:

$$V_{error} = VOUT_{slow} - VOUT_{fast} = RAMP_{slew} * (DELAY_{slow} - DELAY_{fast}). \qquad 1.4$$

It the ramp rate 144 is very slow, or if the difference in the delays 206, 216 is minimal, then the error voltage 208 will be small. Also, if the spacing between the output voltage 104 levels is large, then the error voltage 208 will not have an effect. For high speed systems with large numbers of shading levels, the error voltage 208 defined by equation 1.4 can be a major problem.

Figure 3:
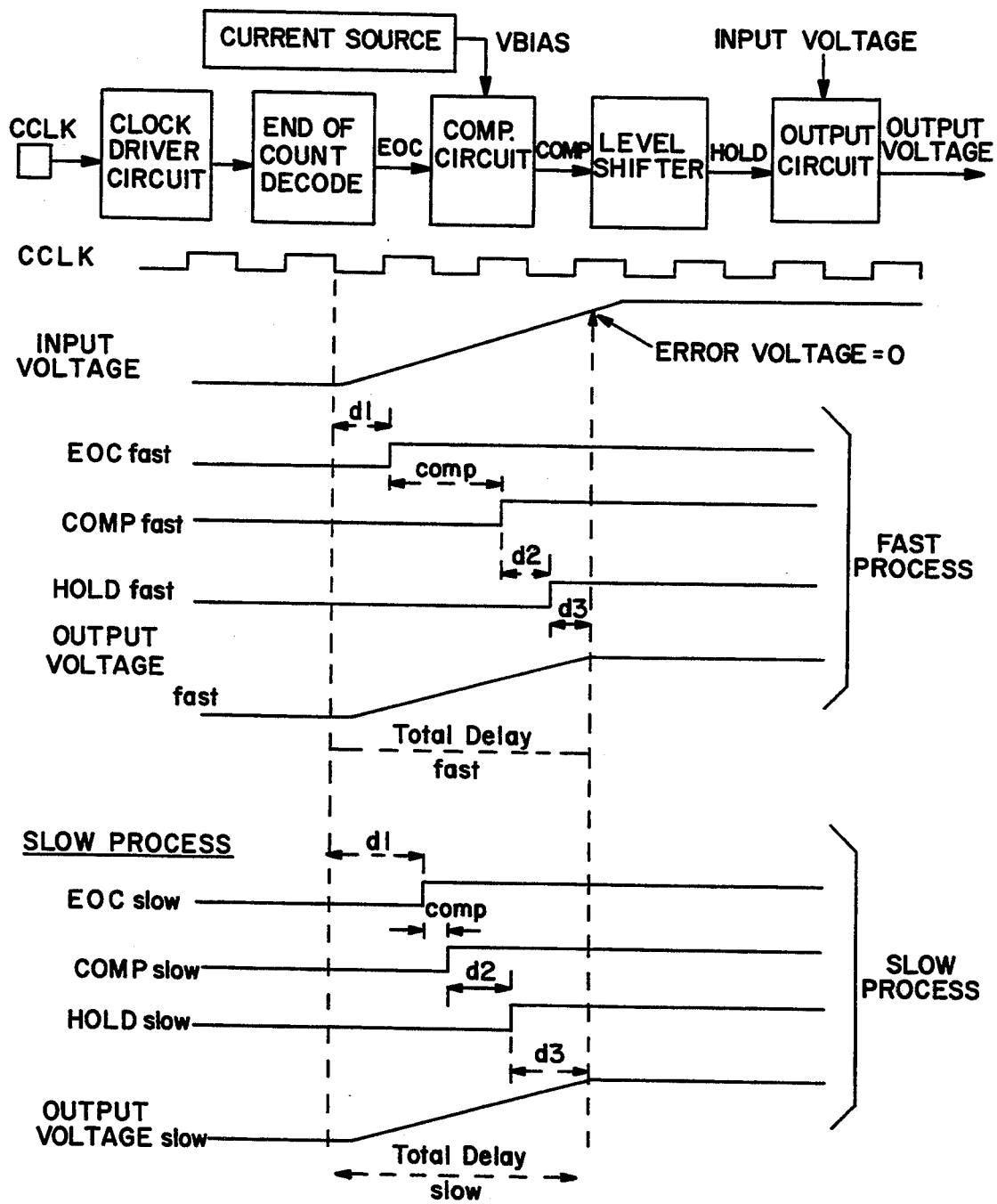
FIG. 3 illustrates the problem of speed variation between different driver chips due to processing differences after compensation to eliminate the speed variations by use of the present invention.

FIG. 3 illustrates the effect of minimizing the error voltage defined by equation 1.4 when the preferred embodiment of a compensation circuit 136 is added to IC 100. FIG. 3 is similar to FIG. 2, but with the addition of the compensation circuit 136. The total delay 206, 216 is now d1 200, 210+comp 304, 306+d2 202, 212+d3 204, 214. The key to the compensation circuit 136 effectiveness is that it will insert a delay 304, 306 in opposite proportion to the speed of the part. The "fast" 218 IC 100 will receive a large "comp" delay 304 while the "slow" 220 IC 100 will receive a small "comp" delay 306. Although the total delay 206, 216 has grown, the error voltage 208 will be reduced. This means that all the IC's 100 will have a larger offset 206, 216 but they will be identical. Since the offset 206, 216 is identical for all parts, it can be designed out by adjusting the phase of the input voltage ramp 144. This will allow all the IC's 100 which drive the LCD panel to produce identical shading levels, a crucial part of any LCD design.

Figure 4:
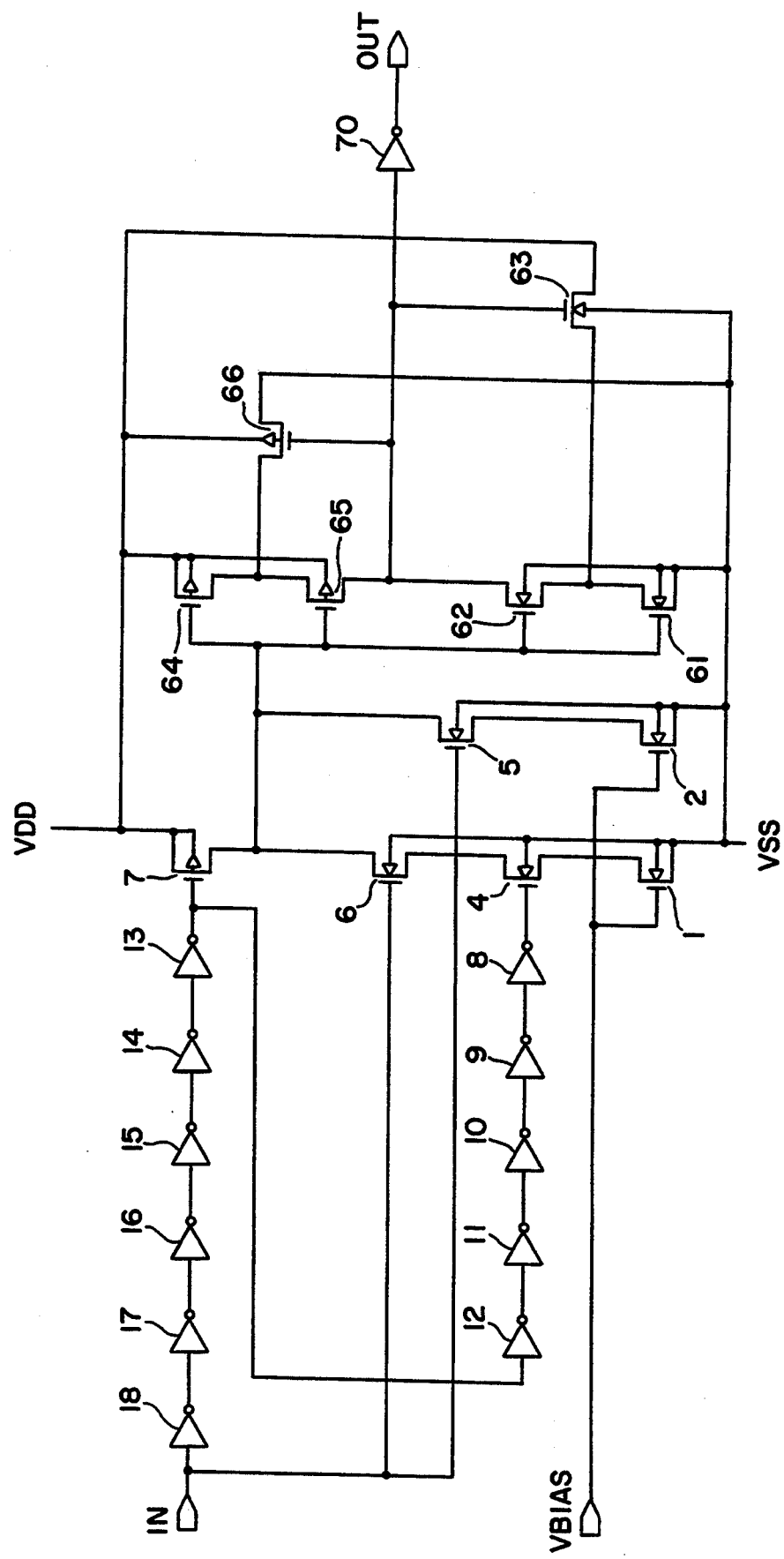
FIG. 4 is a circuit diagram illustrating the inventive compensation circuit.

Moving on to FIG. 4, a detailed diagram of the preferred embodiment of the compensation circuit 136 is illustrated. As hereinbefore stated, the purpose of the compensation circuit 136 is to insert a delay 304, 306 in opposite proportion to the speed of the IC 100. A constant current source is employed and is mirrored in this circuit 136 using the bias voltage VBIAS 402. This controls two current source mirrors in the circuit, a large one 410, and a small one 420. The current sources 410, 420 are used to drive a capacitor, which in the preferred embodiment is the input capacitance of a Schmidt trigger defined by devices 461, 462, 463, 464, 465 and 466. The Schmidt trigger 461-466 is set to switch when the current sources 410, 420 drive it's input gate 404 voltage to a predetermined level. The EOC signal 134 from the decoder 132 is the input to this circuit 136. This will cause a short circuit current through devices 470, 460, 400 and 410 for a time period defined by the delay through the inverter string of 418, 417, 416, 415, 414 and 413. This will allow the current sources 410, 420 to be biased properly for the operation described hereinafter.

When the EOC signal 134 is passed to the output of inverter 413, device 470 will turn off and the input 404 to the Schmidt trigger will start to fall as both current sources 410, 420 turned on. Both current sources 410, 420 will be on only for the time period defined by the delay of the inverter string 412, 411, 410, 490 and 480. When the EOC signal 134 reaches the output of device 480, the large current source 410 will turn off and only the small current source 420 will be left on. This will cause a change in the slope of the input to the Schmidt trigger input gate 404.

Figure 5:
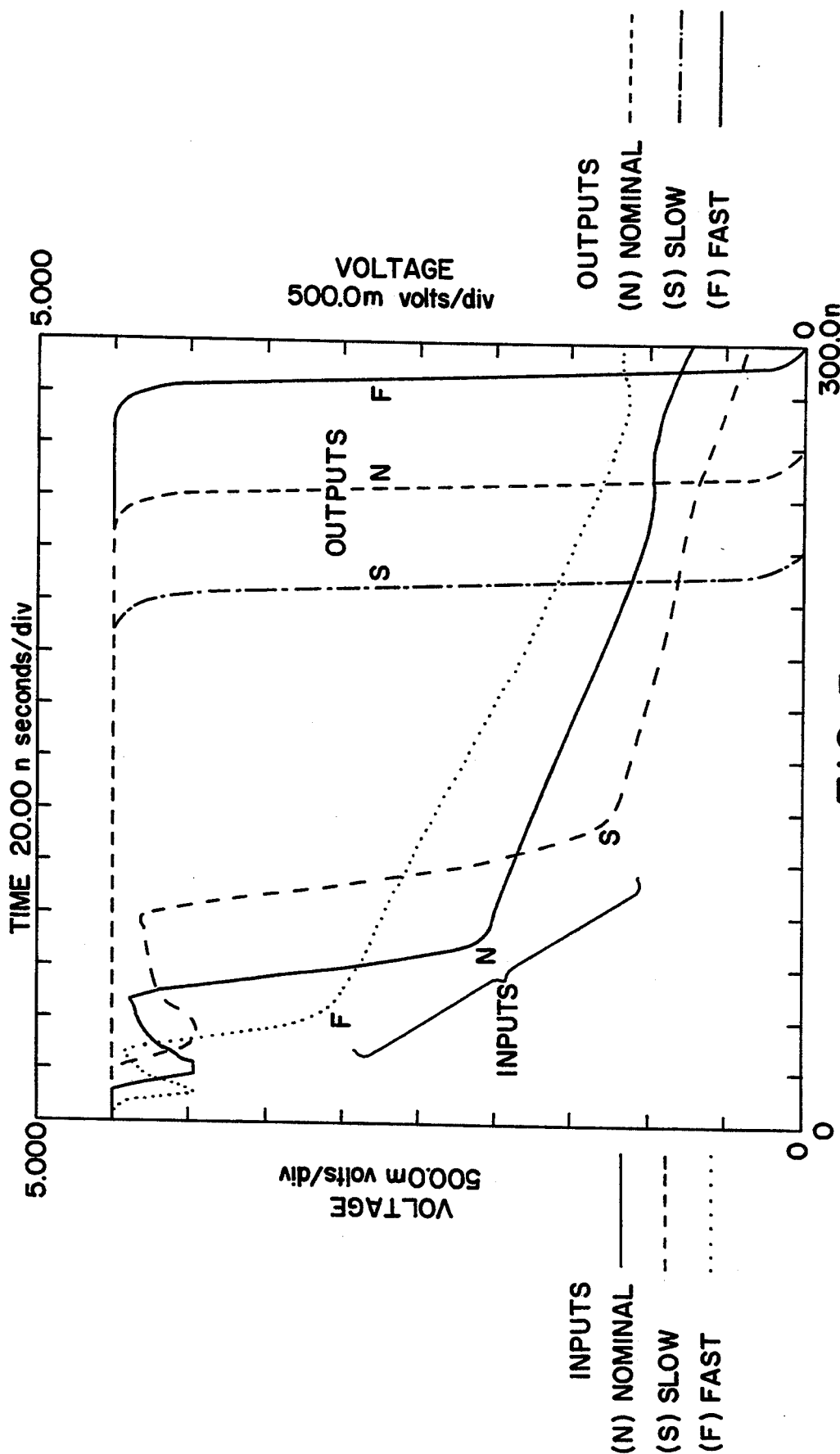
FIG. 5 illustrates the input and output of the Schmidt trigger section of the present invention for three different cases of IC processing, Nominal, Slow and Fast.

Referring now to FIG. 5, the input and output of the Schmidt trigger 461-466 are illustrated for three different cases of IC 100 processing, Nominal 506, 508, Slow 502, 504 and Fast 510, 512. Time zero 514 is the edge of the EOC signal 134 input to the circuit 136. It can be seen in FIG. 5, the initial slope of the inputs 502, 506, 510 for all three cases is identical. This is due to the constant current source drive VBIAS 402. The phase difference is caused by the different delays due to processing. The initial input amplitude reached before the large current source 410 is decoupled from the input gate 404 to the Schmidt trigger is a function of the delay through the inverter string 412, 411, 410, 490 and 480. The faster IC's 100 will reach a lower amplitude in a shorter period of time because the delay is shorter. At the completion of the delay through inverters 412, 411, 410, 490 and 480 the large current source 410 is turned off and the smaller current source 420 remains on. This causes the change in slope (knee) of the inputs 502, 506 and 510 as seen in FIG. 5. Subsequent to the change in slope of the inputs 502, 506 and 510, the signals 502, 506 and 510 continue to have slopes identical to one another due to the constant current source biased by VBIAS 402. However, following the slope change, the faster processes lag the slower ones due to the slope change occurring earlier for the faster IC's 100 than for the slower IC's 100. FIG. 5 further illustrates three output signals 504, 508 and 512 for the Schmidt trigger which are representative of the signal processing which takes place for IC's 100 having nominal, fast and slow response times, and have the inverse delay relationship that is desired.

While the invention has been described above in connection with a particular embodiment, one skilled in the art will appreciate that the invention is not necessarily so limited. It will thus be understood that numerous other embodiments, examples, uses, modifications of, and departures from the teachings disclosed may be made, without departing from the scope of the present invention as claimed herein.

For example, it should be obvious that the slopes of the signals can be changed with appropriate design of the current sources and the loads. This would allow for the design of any difference in delay necessary to compensate for the overall delay in the path from CCLK 130 to the outputs 104. It should also be obvious that the amount of the delay in the compensation circuit 136 is dependent on the speed of the processing because an inverter string is used that will have similar transient effects as the IC 100 path does.

We claim:

1. A signal processing apparatus, comprising:
   a digital input for receiving a digital signal;
   a ramp generator generating a signal with increasing amplitude initiated in response to input of said digital signal;
   a plurality of delay means for defining a hold delay interval as a function of said digital signal;
   a plurality of output means for generating an output signal corresponding to said amplitude of said ramp generator at expiration of a said hold delay interval; and
   wherein each said delay means comprises a compensation means for compensating the said hold delay interval defined by said delay means in opposite proportion to signal propagation speed through said delay means.

2. The signal processing apparatus of claim 1, wherein each said compensation means comprising:
   a constant current source means for providing a bias voltage having a predetermined fixed value;
   Schmidt trigger input means responsively coupled to said current source, for creating a voltage having a slew rate, said slew rate being limited by the predetermined fixed value of said bias voltage;
   level sensing means coupled to Schmidt trigger input wherein said Schmidt trigger input functions as a capacitor means;

means for generating an end of count signal responsively coupled to said level sensing means, said means for generating an end of count signal having a predetermined switching threshold value; and threshold means inversely proportional to propagation time through delay means, such that said hold delay intervals are the same for each said delay means.

* * * * *